(12) United States Patent
Hirata et al.

(10) Patent No.: US 6,567,440 B1
(45) Date of Patent: *May 20, 2003

(54) SEMICONDUCTOR LASER DRIVING METHOD AND OPTICAL DISC APPARATUS

(75) Inventors: Shoji Hirata, Kanagawa (JP); Keigo Aga, Kanagawa (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/129,085

(22) Filed: Aug. 5, 1998

(30) Foreign Application Priority Data

Aug. 5, 1997 (JP) ............................... 9-210690

(51) Int. Cl.[7] ............................... H01S 3/00; H01S 3/13
(52) U.S. Cl. ....................................... 372/38.02; 372/32
(58) Field of Search ........................ 372/26, 32, 38.02, 372/45, 96

(56) References Cited

U.S. PATENT DOCUMENTS

| 4,347,612 A | * | 8/1982 | Fekete et al. ................. 372/50 |
| 4,765,738 A | * | 8/1988 | Henmi ........................ 356/349 |
| 4,796,264 A | * | 1/1989 | Suzuki ........................ 372/29 |
| 4,819,242 A | * | 4/1989 | Kaku et al. ............... 372/38.02 |
| 4,881,235 A | * | 11/1989 | Chinone et al. ................. 372/45 |
| 4,961,197 A | * | 10/1990 | Tanaka et al. ................. 372/45 |
| 5,448,548 A | * | 9/1995 | Taneya et al. .............. 369/121 |
| 5,475,699 A | * | 12/1995 | Sakiyama et al. ............ 372/43 |
| 5,583,881 A | * | 12/1996 | Uchida et al. ................. 372/49 |

FOREIGN PATENT DOCUMENTS

| JP | 07-083797 | * | 3/1995 |
| JP | 09-064474 | * | 3/1997 |

* cited by examiner

*Primary Examiner*—Quyen Leung
(74) *Attorney, Agent, or Firm*—Sonnenschein, Nath & Rosenthal (57) ABSTRACT

A semiconductor laser driving method, which is usable in an optical disc apparatus, for example, makes it possible to use a semiconductor laser in a low noise condition when the semiconductor laser is RF-modulated, by driving the semiconductor laser under a conditions where the average optical output is offset from peaks appearing in a curve representing the relative intensity of noise to average optical output characteristics of the semiconductor laser. More specifically, RF modulating conditions (frequency, amplitude and waveform) are selected so that the peaks do not enter the range of P*±0.5 mW relative to the practically used average optical output P*, for example.

2 Claims, 6 Drawing Sheets

SEMICONDUCTOR LASER DRIVING METHOD AND OPTICAL DISC APPARATUS

BACKGROUND OF THE INVENTION

1. Field of the Invention

This invention relates to a semiconductor laser driving method and an optical disc apparatus, more particularly, to a semiconductor laser driving method for driving a semiconductor laser with a RF-modulated driving current and an optical disc apparatus using the driving method for driving a semiconductor laser used as a light source.

2. Description of the Related Art

As to semiconductor lasers used as light sources of optical pick-up devices in optical disc apparatuses, there are cases where a semiconductor laser is driven by a driving current made by modulating a D.C. current with a high-frequency (RF) current, that is, RF modulation of a semiconductor laser is done, for the purpose of reducing so-called optical feedback noise. In such cases, conventional technologies were configured to optimize the RF-modulating frequency, amplitude and/or waveform, depending on the optical system in which the semiconductor laser is used.

According to recent researches by the Inventor, in optical disc apparatuses used for reproduction of DVD-ROM (digital video disc ROM) with a much higher recording density than CD-ROM (compact disc ROM), a serious increase in jitter, probably caused by noise, was confirmed to occur at a specific optical output, regardless of sufficient RF modulation of an AlGaInP semiconductor laser used as a light source of an optical pick-up. Since such an abnormal increase in jitter invites deterioration of reading characteristics, a countermeasure therefor is desired.

This problem appeared in a process of reproduction of DVD-ROM with a high recording density. Essentially, however, it is presumably caused by the decreased pit sizes along with progressively high recording densities of optical discs. Taking an optical disc with the diameter of 12 cm, for example, the problem becomes apparent when its capacity is on the order of gigabytes. For example, the capacitor of an optical disc with the diameter of 12 cm for use with a semiconductor laser with the oscillation frequency of 650 nm (DVD-ROM, or the like) is 4.7 gigabytes, and the capacity of an optical disc with the diameter of 12 cm for use with a semiconductor laser with the oscillation frequency of 780 nm is 0.64 gigabytes (640 megabytes).

OBJECT AND SUMMARY OF THE INVENTION

It is therefore an object of the invention to provide a semiconductor laser driving method which enables the use of a semiconductor laser under a low noise by preventing an abnormal increase in jitter at a specific optical output when the semiconductor laser is RF-modulated, and to provide an optical disc apparatus using the driving method.

The Inventor made active researches to overcome the above-indicated problems involved in the conventional techniques, as summarized below.

Here are repeated the problems involved in the conventional techniques in greater detail. The Inventor found an abnormal increase in jitter at a specific RF level, namely, at approximately 1.3 V (corresponding to the optical output of about 2.5 mW), in the dependency of jitter upon the RF level (linearly responding to the optical output of the semiconductor laser) obtained upon RF modulation of 350 MHz to an index-guided AlGaInP semiconductor laser with the oscillation frequency of 650 nm used as a light source of the optical pickup in a DVD-ROM optical disc apparatus. This phenomenon appeared under a condition with sufficient RF modulation and always appeared at the same RF level. Therefore, it was not a phenomenon caused by an optical feedback noise. Additionally, the same phenomenon was found also in various types of DVD semiconductor lasers.

Figure 1:
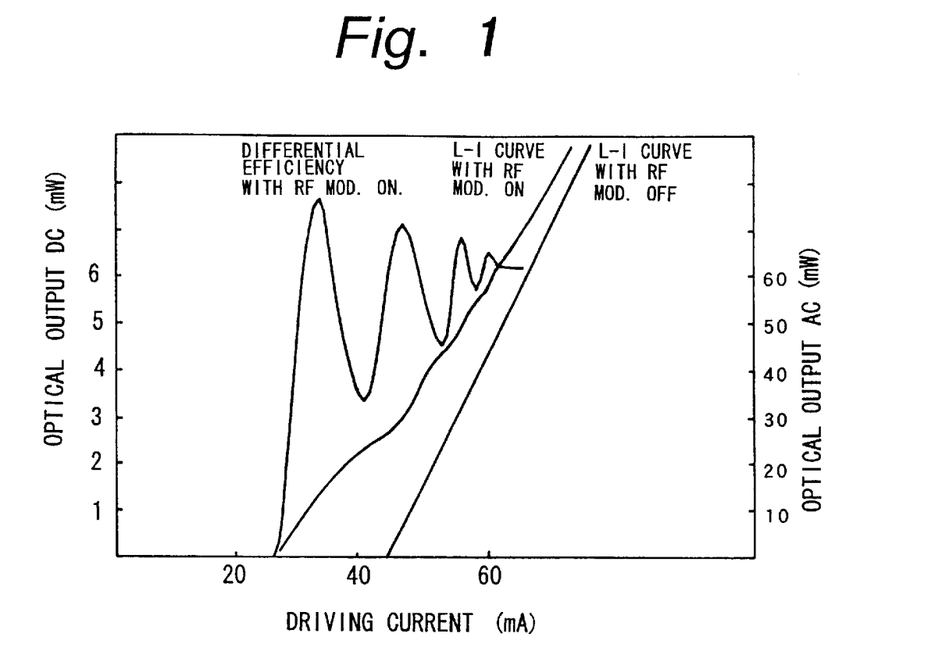
FIG. 1 is a schematic diagram showing optical output to driving current characteristics of a semiconductor laser with and without RF modulation.

FIG. 1 shows typical characteristics of optical output (L) to driving current (I) in both a case with RF modulation and a case without RF modulation. It is known from FIG. 1 that, without RF modulation, namely, in the D.C. driving mode, linear L-I characteristics appear; however, with RF modulation, the threshold current Ith decreases, and non-linear undulation occurs in the L-I characteristics. In terms of changes in differential quantum efficiency, the undulation is periodically attenuating fluctuation. Such undulation in L-I characteristics have not been understood heretofore.

Figure 2:
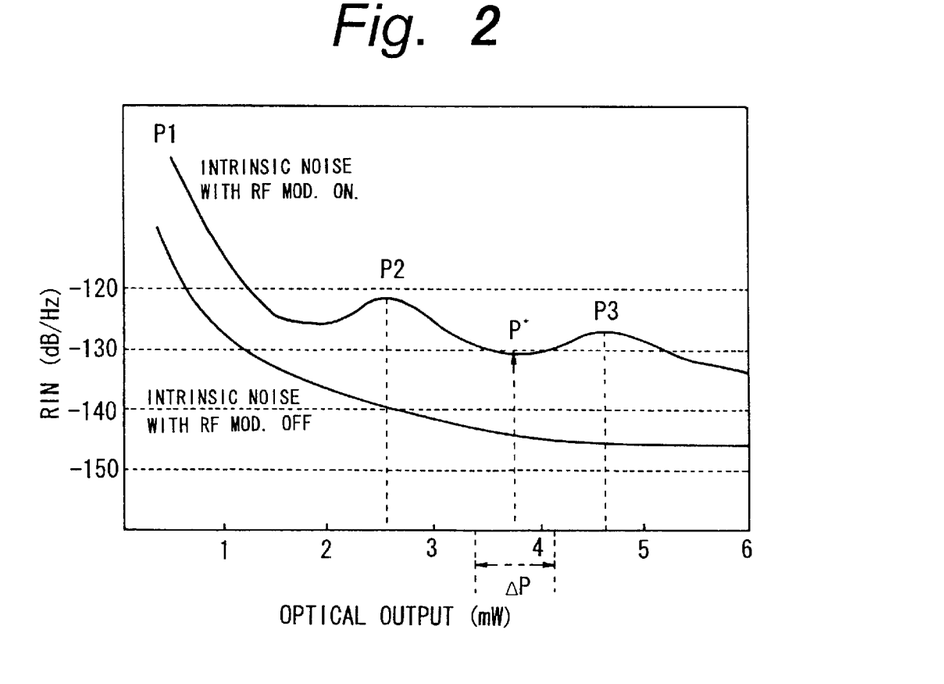
FIG. 2 is a schematic diagram showing relative intensity noise to average optical output characteristics of a semiconductor laser.

The Inventor also found that the intrinsic noise (quantum noise) changed like "lumps" in substantial synchronism with undulation in the L-I characteristics. That is, although typical characteristics of relataive intensity noise (RIN) to average optical output (Pout) of a RF-modulated semiconductor laser are as shown in FIG. 2, the RIN-to-Pout characteristics shown here represent "lump"-like changes in the intrinsic noise approximately synchronizing with the undulation in the L-I characteristics. In FIG. 2, P1, P2, P3, . . . are average optical outputs in which RIN is maximized.

Figure 3:
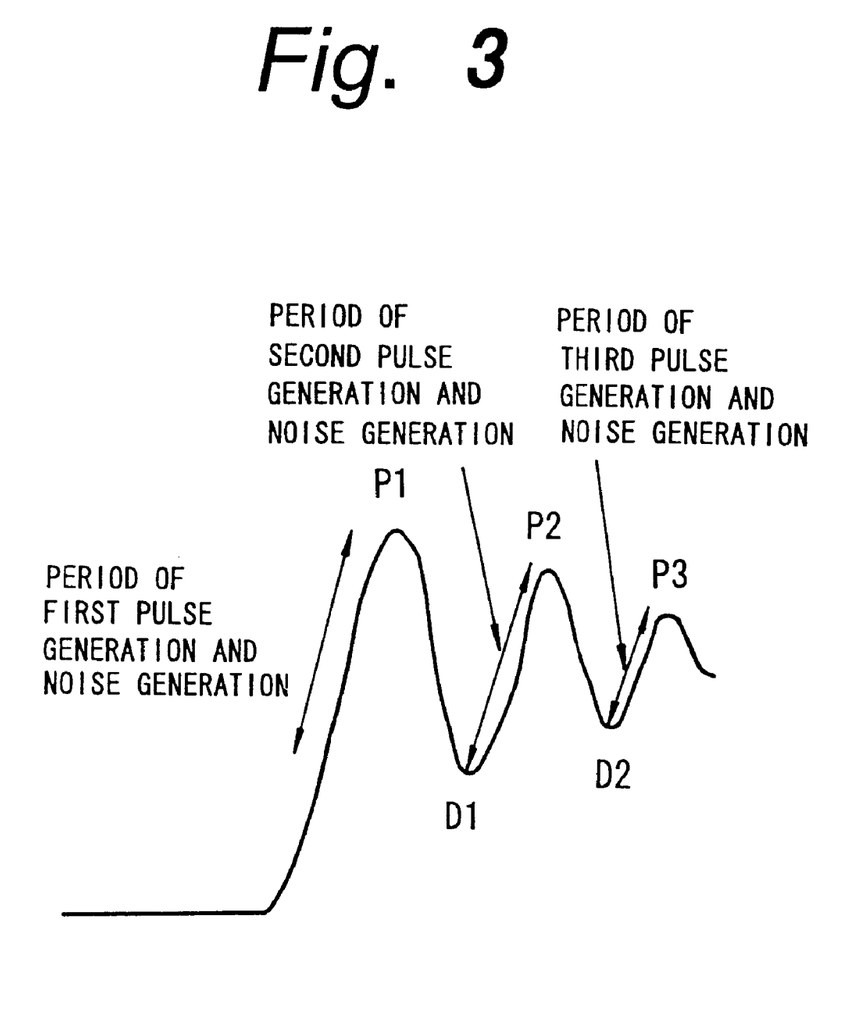
FIG. 3 is a schematic diagram for explaining changes in periodical fluctuation in differential quantum efficiency with relaxation oscillation pulses and generation of noise in a semiconductor laser.

Then, as a result of observation of optical waveforms responsive to RF-modulation, it was found that a first pulse, second pulse and third pulse of relaxation oscillation occurred in synchronism with undulation in L-I characteristics. The start positions of respective pulses substantially coincide with the minimum positions (bottoms) in the L-I characteristics curve, and intrinsic noise derives from occurrence of a new oscillation mode near here. FIG. 3 shows the aspect of this phenomenon. In FIG. 3, D1 and D2 are bottoms in the L-I characteristics curve. Generation of intrinsic noise caused by occurrence of the new oscillation mode is principally a phenomenon similar to an increase in quantum noise caused by occurrence of kinks, and can be regarded as the origin of lumps in the intrinsic noise.

As explained above, it has been confirmed RF modulation of a semiconductor laser invites the phenomenon that the intrinsic noise periodically exhibits peaks at a specific optical output and that RF modulation of a semiconductor laser used as the light source of the optical pickup in an optical disc apparatus causes the problem of increasing the jitter at these peaks. The nature of the phenomenon can be briefed as follows.

Positions of lumps (positions of optical outputs) in the intrinsic noise in RIN-to-Pout characteristics are determined by the relation between relaxation oscillation frequency (fr) of the semiconductor laser and RF-modulation frequency (RF modulation cycle), RF-modulation waveform, RF-modulation amplitude, and so forth, and have the following natures.

(Nature 1) The larger the RF-modulation amplitude, the longer the cycle of changes in "lump" positions in the intrinsic noise.

(Nature 2) The higher the RF-modulation frequency (the shorter the RF-modulation cycle), the longer the cycle of changes in "lump" positions in the intrinsic noise.

(Nature 3) The higher the relaxation oscillation frequency, the shorter the cycle of changes in "lump" positions in the intrinsic noise.

(Nature 4) As the temperature becomes higher, the cycle of changes in "lump" positions in the intrinsic noise becomes slightly longer.

(Nature 5) When the feedback light increases, the noise amount increases and the cycle of changes in "lump" positions in the intrinsic noise becomes shorter.

(Nature 6) When the RF-modulation frequency becomes higher, the noise amount during low optical output decreases.

Figure 4A:
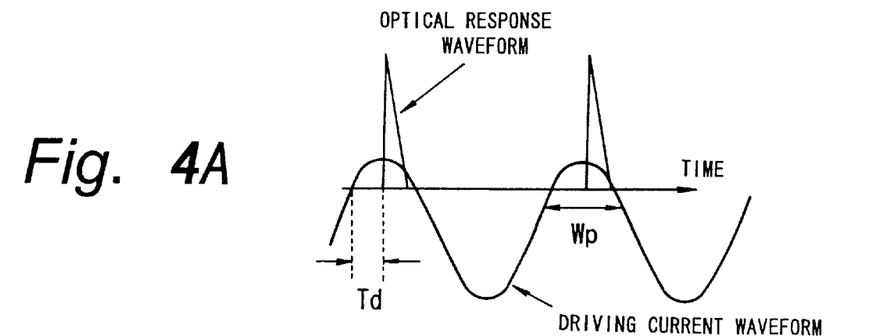
FIGS. 4A, 4B and 4C are schematic diagrams for explaining changes in optical response of a semiconductor laser upon changes in D.C. bias current value.
Figure 4B:
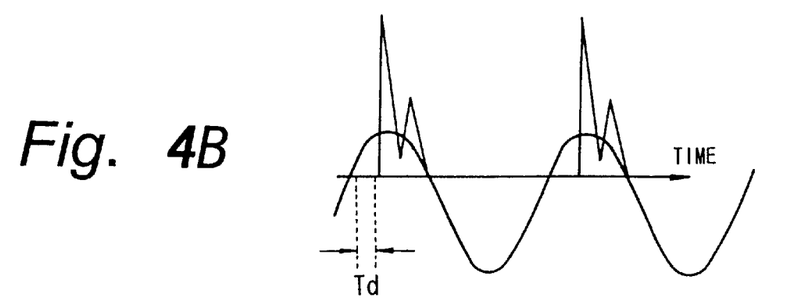
Figure 4C:
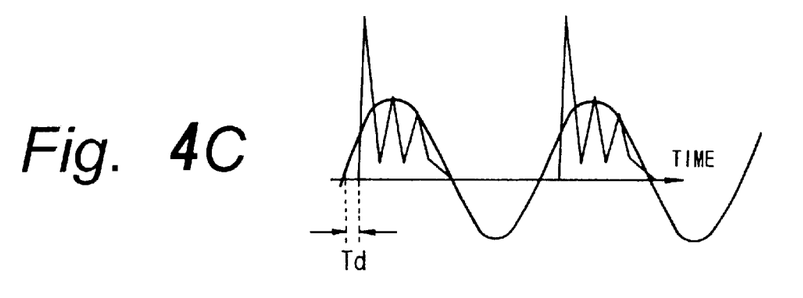

These natures derive from the following reasons. FIGS. 4A to 4C show changes in optical response to changes in D.C. bias current value in which the D.C. bias current value increases from FIG. 4A to FIG. 4B to FIG. 4C. When the D.C. bias current value is low (FIG. 4A), which represents the status where only the first peak of relaxation oscillation is output, the first peak of relaxation oscillation grows in response to the D.C. bias current. When the D.C. bias current value increases to represent the status shown in FIG. 4B where the effective pulse width Wp overlaps excitation of the second peak of relaxation oscillation, the second peak of relaxation oscillation starts to generate. It is known that a semiconductor laser, in general, generates intrinsic noise (quantum noise originating from spontaneous radiation) when a new oscillation mode begins to grow. The oscillation mode found this time is a new oscillation mode in the sense of time, that is, on the time base. As a phenomenon, however, it is considered to be an equivalent physical phenomenon in the sense that a new oscillation mode occurs, and it results in intrinsic noise being produced in response to the new oscillation mode. As the D.C. bias current value increases further, next noise occurs at positions where the third peak of relaxation oscillation appears (FIG. 4C). As the time progresses, these are repeated successively. In FIGS. 4A through 4C, Td denotes the delay time in oscillation of the semiconductor laser.

As explained above, although a RF-modulated semiconductor laser, in general, represents RIN-to-Pout characteristics having "lumps" in intrinsic noise, it is important to suppress "lumps" under a level practically acceptable for its optical output, namely, to RIN<−130 dB/Hz, for example. For this purpose, there is the following countermeasure taking the above discussion into consideration. The basic concept of the countermeasure lies in:

(A) delaying generation of second pulses of relaxation oscillation (shifting them toward high outputs) to decrease the intrinsic noise produced there; or
(B) generating higher order pulses of relaxation oscillation earlier from the beginning (shifting them toward low outputs) to suppress generation thereof later.

If the practical optical output is relatively low than the specification of the semiconductor laser, then the approach (A) is more effective. If it is relatively high, the use of the approach (B) is more effective. If the semiconductor laser is desirably used both for a relatively low optical output and for a relatively high optical output, it is preferable to give preferential to the use for a relatively low optical output and to use the approach (A).

To realize (A), the following approaches may be employed. To realize (B), procedures opposite from the following approaches may be done.
(A-1) Enlarging the RF modulation amplitude.
(A-2) Increasing the RF modulation frequency.
(A-3) Decreasing the relaxation oscillation frequency of the semiconductor laser.
(A-4) Using a narrow rectangular wave is used as the RF modulation waveform.

When using (A-1), attention is called to the possibility of degrading the reliability due to excessive enlargement of first pulses of relaxation oscillation. Although (A-2) involves the same problem as (A-1), this can be overcome by setting the RF modulation amplitude slightly smaller. (A-2) is convenient because it contributes to suppression of the entire intrinsic noise as explained in (Nature 6).

(A-3) can be realized by increasing the edge surface reflectivity, increasing the cavity length, and/or reducing the quantum well effect. These approaches degrade the essential characteristics of the semiconductor laser and are not desirable. Nevertheless, if no other method is found, they are worth while to take into consideration. (A-4) is very effective, but involves the same problem as (A-1). However, in case of a high-output semiconductor laser whose edge surface is strong against breakage, it is worth while to use. The RF modulation waveform need not be strictly rectangular, but it is sufficient to be a short pulse relative to the relaxation oscillation frequency fr of the semiconductor laser.

The description made above has been directed to the reading process in the optical disc apparatus. Basically, however, the same applies also to the writing process.

According to the first invention of the present invention, there is provided a semiconductor laser driving method for driving a semiconductor laser with a driving current made by modulating a D.C. current with a high-frequency current, characterized in:

a curve representing relative intensity noise to average optical output characteristics of the semiconductor laser having at least one peak; and the semiconductor laser being driven under a condition where the average optical output is offset from the peak.

According to the second invention of the present invention, there is provided an optical disc apparatus using a semiconductor laser as a light source thereof and configured to drive the semiconductor laser with a driving current made by modulating a D.C. current with a high-frequency current, characterized in:

a curve representing relative intensity noise to average optical output characteristics of the semiconductor laser having at least one peak; and the semiconductor laser being driven under a condition where the average optical output is offset from the peak.

An example of the relative intensity noise (RIN) to average optical output (Pout) of the semiconductor laser according to the invention is as shown in FIG. 2. In FIG. 2, peaks P2 and P3 are lumps in intrinsic noise.

When the average optical output (recommended average optical output) used with the semiconductor laser is P*, conditions for modulation by RF current are typically determined so that peaks do not fall within P*±ΔP (where ΔP is the margin for the average optical output (recommended average optical output (see FIG. 2)), more specifically, within P*±0.5 mW. In this manner, the semiconductor laser can be used with low noise by avoiding "lumps" in intrinsic noise while providing a practically ample margin for the efficiency of use of laser light. For example, as to optical disc apparatuses, an ample margin can be ensured to cope with variety among different lots of optical pickup devices, and the manufacturing yield can be increased significantly.

In order to use the semiconductor laser with low noise by avoiding "lumps" in the intrinsic noise when the average optical output used with the semiconductor laser is lower than 10 mW, the frequency fm of the RF current is determined to satisfy $fr \geq fm \geq fr/5$ where fr is the relaxation oscillation frequency of the semiconductor laser. This corresponds to the approach (A-2) of the countermeasure (A) explained before.

In order to use the semiconductor laser with low noise by avoiding "lumps" in the intrinsic noise, a rectangular wave may be used as the driving current waveform, setting the pulse width Wp of the driving current to satisfy $Td+1/fr \leq Wp \leq Td+2/fr$ where Td is the delay time in oscillation the semiconductor laser. This corresponds to the approach (A-4) in the countermeasure (A) explained before.

In order to use the semiconductor laser with low noise by avoiding "lumps" in the intrinsic noise when the average optical output used with the semiconductor laser is higher than 10 mW, the frequency fm of RF current is determined to satisfy $fr \geq fm \geq fr/10$ where the fr is the relaxation oscillation frequency of the semiconductor laser. This corresponds to the approach (A-2) of the countermeasure (A) explained before.

In case that the semiconductor laser is desired to practically use both for relatively low optical output and for relatively high optical output, if the RF modulation conditions are fixed to meet one of the requirements, the average optical output used to meet the other requirement is set to a value amply offset from peaks shown in FIG. 2.

Basically, the semiconductor laser used here may be of any type in terms of semiconductor materials, laser structures, structures of active layers, and so on. AlGaInP semiconductor laser and AlGaAs semiconductor lasers are specific examples thereof. If the active layer has a quantum well structure, there remain various choice in whether a strained quantum well structure is used or not, how much the strain should be, how the number of quantum wells and the thickness of well layers should be determined, for example.

According to the invention having the above-summarized construction, since the curve representing the relative intensity noise to average optical output characteristics of the semiconductor laser include at least one peak, and the semiconductor laser is driven under conditions ensuring average optical output offset from the peaks, the semiconductor laser can be used with low noise by avoiding "lumps" in intrinsic noise.

The above, and other, objects, features and advantage of the present invention will become readily apparent from the following detailed description thereof which is to be read in connection with the accompanying drawings.

DETAILED DESCRIPTION OF THE PREFERRED EMBODIMENTS

Explained below some embodiments of the invention with reference to the drawings.

First explained is the first embodiment of the invention which corresponds to the approach (A-2) of the countermeasure (A) explained before.

Figure 5:
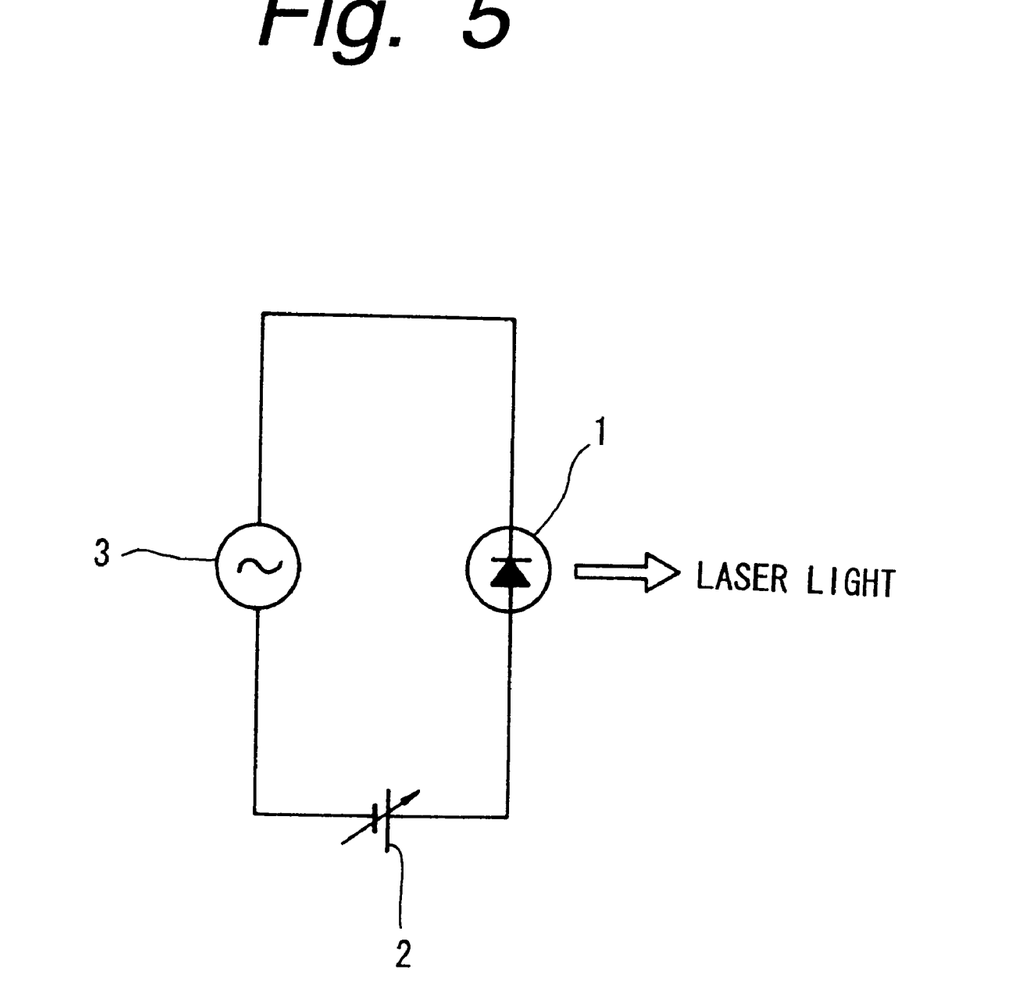
FIG. 5 is a circuit diagram of a driving circuit of a semiconductor laser.

FIG. 5 shows a driving circuit of the semiconductor laser. In FIG. 5, reference numeral 1 denotes a semiconductor laser, 2 a D.C. bias current source, and 3 a RF current source. Supplied to the semiconductor laser 1 to drive it is a driving current modulating a D.C. bias current from the D.C. bias current source 2 by RF current from the RF current source 3.

In the first embodiment, the RF modulation frequency fm is set to 600 MHZ or higher, and the RF modulation amplitude am is set to approximately 5 mA in terms of $\Delta I_{th}$. The relaxation oscillation frequency fr of the semiconductor laser 1 is held under approximately 3 GHz at approximately 5 mW. For this purpose, within an extent not deteriorating the basic characteristics of the semiconductor laser 1 practically unacceptably and not adversely affecting the reliability, one or more of the approaches are employed, namely, increasing the edge surface reflectivity of the semiconductor laser 1, increasing the cavity length, or decreasing the quantum well effect when the semiconductor laser 1 has a quantum well structure.

Figure 6:
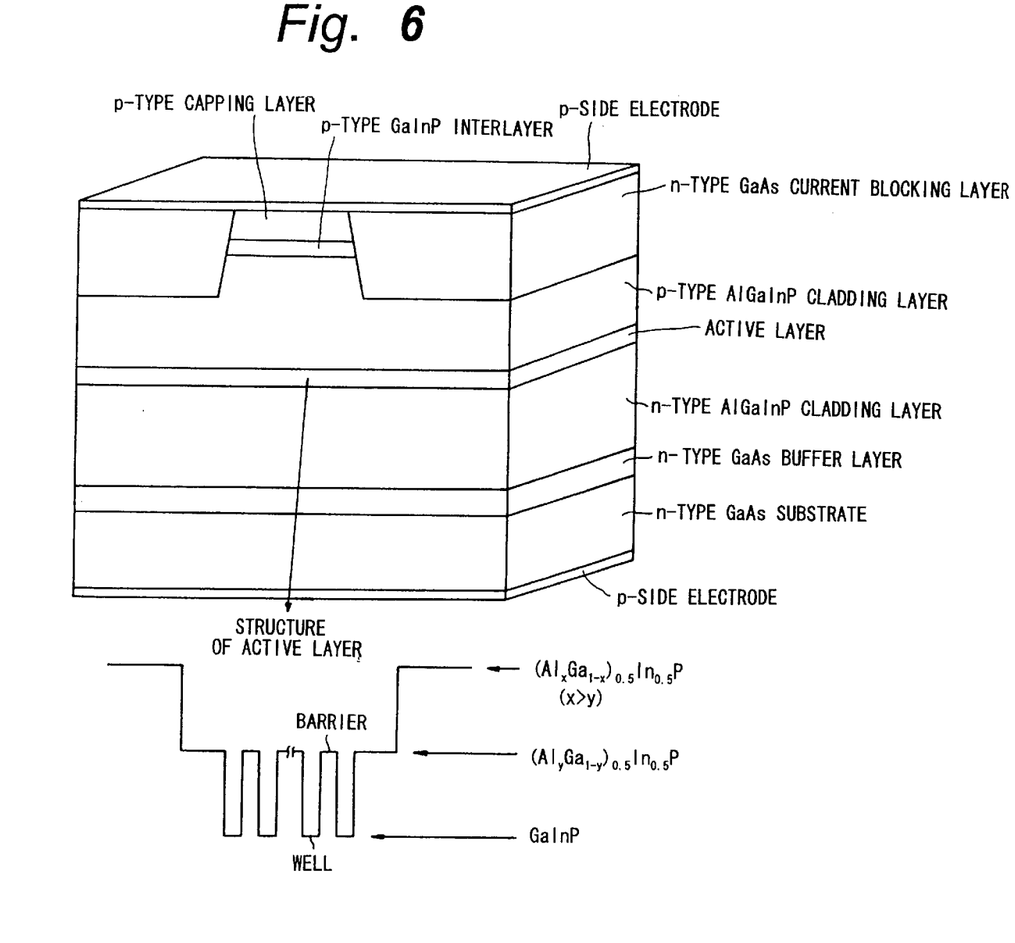
FIG. 6 is a schematic diagram showing an index-guided AlGaInP semiconductor laser.

An example of the semiconductor laser 1 is an index-guided AlGaInP semiconductor laser having an active layer of a quantum well structure as shown in FIG. 6.

According to the first embodiment, setting the RF modulation frequency fm not lower than 600 MHz, setting the RF modulation amplitude am approximately 5 mA in terms of $\Delta I_{th}$ and limiting the relaxation oscillation frequency fr below approximately 3 GHz at approximately 5 mW, it is possible to avoid "lumps" in intrinsic noise, as shown in FIG. 2, and to use the semiconductor laser 1 in a low noise condition for optical output minimizing the noise.

Figure 7:
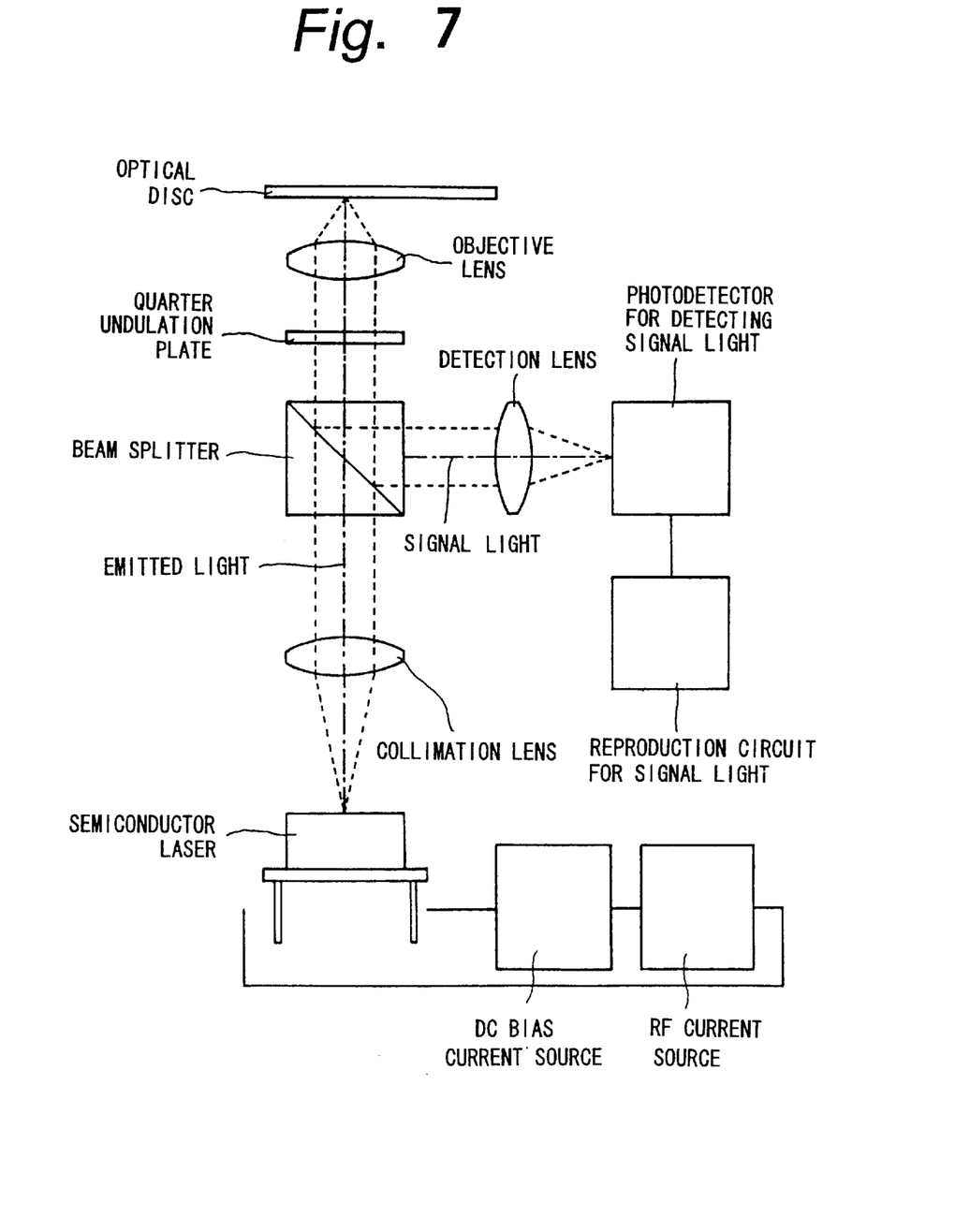
FIG. 7 is a schematic diagram showing an optical disc recording and/or reproducing apparatus.

Therefore, when the driving method according to the first embodiment is used to drive a semiconductor laser used as the light source of an optical pickup in an optical disc recording and/or reproducing apparatus as shown in FIG. 7, it is possible to suppress the jitter during reading and/or writing under a sufficiently low level for practical use during reading and/or writing and to obtain excellent reading characteristics and writing characteristics. Even when an optical feedback exists, since a large noise occurs near "lumps" in the intrinsic noise, the driving method according to the first embodiment can be used to effectively suppress generation of the noise and to obtain excellent reading characteristics and/or writing characteristics. Moreover, a single semiconductor laser is used to issue a plurality of optical outputs, such as the use for both reading and writing, both the reading characteristics and the writing characteristics can be improved by using the driving method according to the first embodiment. An exemplary optical disc recording and/or reproducing apparatus is a DVD-ROM reproducing apparatus using an index-guided AlGaInP semiconductor laser for oscillation frequency of 650 nm as the light source of its optical pickup.

Next explained is the second embodiment of the invention employing the countermeasure (B) explained before under the requirement of using the semiconductor laser 1 for relatively high optical outputs.

In the second embodiment, the RF modulation frequency fm is set not higher than 500 MHz. If fm is too low, the intrinsic noise may increase entirely as explained in (Nature 6). Additionally, the embodiment taken here is directed to the use of the semiconductor laser for relatively high optical outputs. Therefore, the minimum value of fm will be around 100 MHz, practically. The RF modulation amplitude am is set as low as possible within the extent capable of suppressing optical feedback noise. Specifically, it is set not larger than approximately 7 mA in terms of $\Delta I_{th}$, although it depends upon fm. The relaxation oscillation frequency fr of the semiconductor laser 1 is set not lower than 4 GHz, approximately, under 5 mW, approximately.

According to the second embodiment, similarly to the first embodiment, it is possible to avoid "lumps" in the intrinsic noise as shown in FIG. 2, and to use the semiconductor laser 1 in a low noise condition for optical outputs minimizing the noise.

Here again, when the driving method according to the second embodiment is used to drive a semiconductor laser used as the light source of an optical pickup in an optical disc recording and/or reproducing apparatus, excellent reading characteristics and/or writing characteristics are obtained.

Having described specific preferred embodiments of the present invention with reference to the accompanying drawings, it is to be understood that the invention is not limited to those precise embodiments, and that various changes and modifications may be effected therein by one skilled in the art without departing from the scope or the spirit of the invention as defined in the appended claims.

For example, the first embodiment has been explained as setting the RF modulation frequency fm not lower than 600 MHz, setting the RF modulation amplitude am about 5 mA in terms of $\Delta I_{th}$ and limiting the relaxation oscillation frequency fr of the semiconductor laser 1 within approximately 3 GHz under 5 mW. However, by merely setting the RF modulation frequency fm not lower than 600 MHz and setting the RF modulation amplitude am about 5 mA in terms of $\Delta I_{th}$, practically sufficient effects can be obtained. If the semiconductor laser 1 is not adversely affected in reliability even when the RF modulation amplitude am is increased, restriction of the RF modulation amplitude am is not necessary. From the viewpoint of the effect by the countermeasure (A), the larger the RF modulation amplitude am, the larger the effect. This is effective especially when the use of the semiconductor laser 1 in a low noise condition both for low optical outputs and for high optical outputs is desired.

In the second embodiment, by using a rectangular wave with a wider pulse width as the pulse waveform, the semiconductor laser can be used in a lower noise condition. When a countermeasure is used on the part the semiconductor laser 1 itself, such as making the stripe width narrower or employing a gain-guided structure to diffuse the injected current in the transverse direction and to attenuate relaxation oscillation, the effect is greater.

As described above, the semiconductor laser driving method according to the invention can prevent an abnormal increase in jitter at a particular optical output when the semiconductor laser is RF-modulated, and the semiconductor laser can be used in a low noise condition.

According to the optical disc apparatus according to the invention, since the semiconductor laser can be used in a low noise condition, excellent reading characteristics and/or writing characteristics are obtained.

What is claimed is:

1. A semiconductor laser driving method, the method comprising the step of:

generating a driving current by modulating a D.C. current with a high-frequency current; and driving a semiconductor laser with the driving current;

wherein said semiconductor laser is characterized by a curve representing relative intensity noise to average optical output, the curve having at least one peak caused by modulating the D.C. current with the high-frequency current; and wherein said semiconductor laser is driven under a condition where the average optical output is offset from said peak.

2. The semiconductor laser driving method according to claim 1 wherein the modulating conditions provided by said high frequency current are determined wherein said peak does not enter in the range of P*±0.5 mW, and where P* is the average optical output of said seconductor laser.

\* \* \* \* \*